United States Patent [19]

Shirai

[11] Patent Number: 5,737,264
[45] Date of Patent: Apr. 7, 1998

[54] NON-VOLATILE SEMICONDUCTOR MEMORY CELL

[75] Inventor: Hiroki Shirai, Tokyo, Japan

[73] Assignee: NEC Corporation, Japan

[21] Appl. No.: 621,479

[22] Filed: Mar. 25, 1996

[30] Foreign Application Priority Data

Mar. 30, 1995 [JP] Japan .................. 7-072922

[51] Int. Cl.$^6$ .................................................. G11C 11/34
[52] U.S. Cl. ................... 365/185.01; 365/185.18; 365/185.29; 257/315
[58] Field of Search ............... 365/185.01, 185.18, 365/185.29; 257/314, 315, 316, 318

[56] References Cited

U.S. PATENT DOCUMENTS

| | | | |
|---|---|---|---|
| 4,835,740 | 5/1989 | Sato | 365/185.01 |
| 4,868,619 | 9/1989 | Mukherjee et al. | 257/316 |
| 5,345,104 | 9/1994 | Prall et al. | 257/316 |
| 5,446,298 | 8/1995 | Kojima | 257/314 |
| 5,491,657 | 2/1996 | Haddad et al. | 365/185.18 X |
| 5,574,685 | 11/1996 | Hsu | 257/316 X |

FOREIGN PATENT DOCUMENTS

| | | | |
|---|---|---|---|
| 64-81272 | 3/1989 | Japan | H01L 29/78 |
| 1-283880 | 11/1989 | Japan | H01L 29/78 |
| 5-347418 | 12/1993 | Japan | |

OTHER PUBLICATIONS

"Process and Device Technologies For 16Mbit EPROMs with Large–Tilt–Angle Implanted P–Pocket Cell" Ohshima et al; 1990; IEEE; pp. 95–98.

*Primary Examiner*—Huan Hoang
*Attorney, Agent, or Firm*—Hayes, Soloway, Hennessey, Grossman & Hage, P.C.

[57] ABSTRACT

A non-volatile semiconductor memory cell comprises a source region having an N$^+$ type diffusion layer, an N$^-$ diffusion layer, and N type diffusion layer, the N$^-$ type diffusion layer being formed by injecting phosphorus ions by an inclined rotating ion injecting method. The overlap width of the N$^-$ type diffusion layer and the floating gate electrode is larger than the overlap width of the N$^+$ type diffusion layer and the floating gate electrode, and the junction depth of the N type diffusion layer is larger than the junction depth of the N$^+$ type diffusion layer. Thus, in flash memory having memory cells according to the present invention, even if the size of the memory cells is reduced, erase time can be shortened without sacrificing erase function and performance.

4 Claims, 14 Drawing Sheets

NON-VOLATILE SEMICONDUCTOR MEMORY CELL

BACKGROUND OF THE INVENTION

1. Field of the Invention

The present invention relates to a non-volatile semiconductor memory cell, in particular, to a flash memory having stacked-gate, source-erase type memory cells and a fabrication method thereof.

2. Description of the Related Art

A flash memory is a known example of an electrically rewritable non-volatile semiconductor memory cell (EEPROM: Electrically Erasable and Programmable Read Only Memory). In flash memory, the contents of a plurality of memory cells in a particular region are erased at the same time. The flash memory has stacked-gate, source-erase type memory cells.

An example of such a flash memory is disclosed in JPA Sho 64-81272, which will be described with reference to the accompanying drawings.

FIG. 1 is a schematic plan view showing a structure of the prior art flash memory, FIG. 2a a sectional view taken along line X—X shown in FIG. 1, and FIG. 2b a sectional view taken along line Y—Y shown in FIG. 1. Referring to FIGS. 1, 2a, and 2b, the flash memory has stacked-gate, source-erase type memory cells formed corresponding to the conventional 0.6 μm design rule.

A P type silicon substrate 201 has a face orientation of (100). The surface impurity concentration of the P type silicon substrate 201 is approximately $2 \times 10^{17}$ cm$^{-3}$. The P type silicon substrate 201 has a plurality of device separating regions. In the device separating regions, field oxide film 202 is formed having a thickness of approximately 0.6 μm. Moreover, in the device separating regions, stacked-gate type memory cells are formed. Each of the memory cells is composed of a gate oxide film 203, floating gate electrode 204, gate insulation film 205, control gate electrodes 206a, 206b, 206c and so forth, source regions 207ab, 207cd and so forth, and drain region 208. The gate oxide film 203 is formed on the P type silicon substrate 201. The thickness of the gate oxide film 203 is approximately 10 nm. The floating gate electrode 204 is formed on the front surface of the P type silicon substrate 201 through the gate oxide film 203. The floating gate electrode 204 is composed of an N type polycrystalline silicon film whose impurity concentration is approximately $1 \times 10^{19}$ cm$^{-3}$ and whose thickness is approximately 150 nm. The gate insulation film 205 is formed on the front surface of the floating gate electrode 204. The gate electrode 204 is a layer laminate of an oxide silicon film with a thickness of approximately 7 nm, silicon nitride film with a thickness of approximately 10 nm, and silicon oxide film with a thickness of approximately 3 nm. The control gate electrodes 206a, 206b, 206c and so forth are formed on the floating gate electrode 204 through the gate insulation film 205. The control gate electrodes 206a, 206b, 206c and so forth also function as word lines. The control gate electrodes 206a, 206b, 206c and so forth are composed of N$^+$ type polycrystalline silicon film with a thickness of approximately 150 nm. The source regions 207ab, 207cd and so forth are formed on the front surface of the P type silicon substrate 201. The drain region 208 is formed on the front surface of the P type silicon substrate 201. The distance between the control gate electrode 206a and the control gate 206b is 1.2 μm. The distance between the control gate electrode 206b and the control gate electrode 206c is 1.6 μm. Each memory cell has one floating gate electrode 204. The gate length and gate width of the memory cell are for example 1.2 μm and 1.2 μm, respectively. The drain region 208 is composed of a second N$^+$ type diffusion layer that is self-aligned to, for example, the control gate electrodes 206b and 206c, floating gate electrode 206, and field oxide film 202. These junction surfaces of the drain region 208 against the control gate electrodes 206b and 206c, the floating gate electrode 206, and the field oxide film 202 are covered by a P$^-$ type diffusion layer 209. The P$^-$ type diffusion layer 209 is formed more deeply than the drain region 208 in the P type silicon substrate 201. One drain region 208 is shared by two memory cells. The drain region 208 is connected to bit lines 212a, 212b and so forth through bit contact holes 211a, 211b and so forth formed in an inter-layer insulation film 210 that covers the memory cells. The bit lines 212a, 212b and so forth are formed perpendicular to the control gate electrodes 206a, 206b, 206c and so forth through the inter-layer insulation film 210.

The source regions 207ab, 207cd and so forth are composed of a first N$^+$ type diffusion layer 217 and an N type diffusion layer 227. The first N$^+$ type diffusion layer 217 is more deeply formed than a second N$^+$ type diffusion layer that is the drain region in the P type silicon substrate 201. The N type diffusion layer 227 is more deeply formed than the first N$^+$ type diffusion layer 217 in the P type silicon substrate 201. For example, the source region 207ab is formed on the front surface of the P type silicon substrate 201 so that the source region 207ab is self-aligned to the control gate electrodes 206a and 206b, the floating gate electrode 206, and the field oxide film 202. The source region 207ab is shared by a predetermined number of memory cells corresponding to the control gate electrodes 206a and 206b. The source region 207ab is connected to lines formed in parallel with the bit line 212a and so forth on the front surface of the inter-layer insulation film 210 through contact holes (not shown) formed in the inter-layer insulation film 210. The contact holes are formed at intervals of for example 16 bits.

Data write and erase operations for the above-described memory cells will now be described. In the following description, voltage applied to the drain region 208, voltage applied to the source region 207ab and so forth, voltage applied to the control gate electrode 206a and so forth, and voltage applied to the P type silicon substrate 201 are denoted by $V_{DD}$, $V_{SS}$, $V_{CG}$, and $V_{SUB}$, respectively.

When $V_{SS}$=0V, $V_{SUB}$=0V, $V_{DD}$=5.2V for only the bit line 212a ($V_{DD}$=0V for bit line 212b and so forth), and $V_{CG}$=12V for only the control gate electrode 206b ($V_{CG}$=0V for control gate electrode 206a and so forth), data write operation is performed for only the memory cell corresponding to the bit line 212a and the control gate electrode 206b. The voltage of the floating gate electrode 204 of the memory cell is divided by the ratio of electrostatic capacitances of the gate oxide film 203 and the gate insulation film 205. In the memory cell that is turned on, current flows between the drain region 208 and the source region 207. When the voltage of the floating gate electrode 204 of the memory cell is approximately 5.2V (namely, $V_{DD}$=approximately 5.2V), pinch-off point is present near the drain region 208. Since the electric field becomes strong near the pinch-off point, hot electrons (that have energy higher than insulation potential energy of the gate oxide film 203) are generated and enter the floating gate electrode 204. As the electrons that enter the floating gate electrode 204 increase, the voltage of the floating gate electrode 204 drops to a negative level. Thus, the threshold voltage of the memory cell (from a view point of the control gate electrode 206b) shifts in the positive direction and becomes approximately 7V. The P⁻ type diffusion layer 209 is formed so as to suppress expansion of the depletion layer of the drain region 208 (when the data write operation is performed). Thus, the pinch-off point approaches the drain region 208.

To erase data stored in a memory cell, electrons that entered the floating gate electrode 204 should be removed. In a flash memory, data is erased for each memory cell array. When $V_{SS}$=8V for the source region 207ab (the source region 207cd and so forth), $V_{CG}$=0V (for all the control gates 206a, 206b, 206c and so forth), $V_{SUB}$=0V (for all the drain regions 208), $V_{DD}$=OPEN, data erase operation is performed. When the data write operation is performed for only the memory cell corresponding to the bit line 212a and the control gate electrode 206b, the voltage of the gate oxide film 203 of the memory cell is higher than 8V compared with the other memory cells. Thus, a strong electric field is applied to the gate oxide film 203. Consequently, a Fowler-Noldheim current (hereinafter referred to as "FN current") corresponding to quantum tunnel effect flows. As a result, electrons are removed from the floating gate electrode 204 of the memory cell. In the flash memory, even if data is erased in a predetermined condition, the threshold voltages of memory cells from which data are erased fluctuate for a width of approximately 2V. These erase voltages are referred to as erase threshold voltages. On the other hand, if the erase threshold voltage of a particular memory cell becomes 0V or less, data cannot be written to memory cells that share the bit line with the particular memory cell. Thus, erase conditions should be set so that the minimum value and the maximum value of the erase threshold voltages are for example 0.5V and 3.5V, respectively. The N⁺ type diffusion layer 217, which composes the source region 207ab and so forth, is more deeply formed than the drain region 208 so as to increase the current capacity in the data erase operation. In addition, the N type diffusion layer 227 is formed in the source region 207ab so as to increase the junction withstand voltage of the source region 207ab to a voltage higher than for example 5.2V.

With reference to FIGS. 12, 2a, 2b, 3a to 3d, 4a, 4b, 5a, and 5b, the fabrication method of the conventional flash memory will be described. FIGS. 3a to 3d, 4a, and 4b are cross-sectional views taken along line X—X shown in FIG. 1 for explaining fabrication steps of the conventional flash memory. FIGS. 5a and 5b are cross-sectional views taken along line Y—Y shown in FIG. 1 for explaining the fabrication steps of the conventional flash memory.

A field oxide film 202 is formed in a device separating region on the front surface of a P type silicon substrate 201. A gate oxide film 203 is formed in a device forming region on the front surface of the P type silicon substrate 201 by a heat oxidizing process. An N type polycrystalline silicon film is formed on the entire surface of the resultant structure. The polycrystalline silicon film is patterned in a stripe shape in parallel with bit lines. Thus, a polycrystal silicon film pattern 214 is formed. Thereafter, a gate insulation film 205 is formed on the entire surface of the resultant structure. Next, an N⁺ type polycrystalline silicon film 216 is formed on the entire surface of the resultant structure (see FIGS. 2a and 5a).

Thereafter, a polycrystalline silicon film 216, the gate insulation film 205, and the polycrystalline silicon film pattern 214 are successively patterned. Thus, control gate electrodes 206a, 206b, 206c and so forth (composed of the polycrystalline silicon film 216) and a floating gate electrode 204, which is composed of the polycrystalline silicon film pattern 216, are formed (see FIGS. 3b, 5b, and 1).

Thereafter, a silicon oxide film (not shown) with a thickness of approximately 10 to 20 nm is formed on the exposed surfaces of the control gate electrodes 206a, 206b, 206c and so forth and the floating gate electrode 204 and the front surface of the P type silicon substrate 201 by the heat oxidizing process.

A first photoresist film pattern 247 with a thickness of approximately 1.0 µm is formed. The first photoresist film pattern 247 covers a source forming region. The first photoresist film pattern 247 has an opening portion at a source forming region. Arsenic ions of $5\times10^{15}$ cm$^{-2}$ are injected nearly in parallel with the normal of the front surface of the P type silicon substrate 201 with a mask of the photoresist film pattern 247 at 70 KeV. Thus, a first arsenic ion injected layer 217A is formed in the P type silicon substrate 201. Thereafter, phosphorus ions of $1\times10^{15}$ cm$^{-2}$ are injected nearly in parallel with the normal of the front surface of the P type silicon substrate 201 with the mask of the photoresist film pattern 247 at 150 KeV. Thus, a phosphorus ion injected layer 227A is formed in the P type silicon substrate 201 (see FIG. 3c).

After the photoresist film pattern 247 is removed, a first heating process is performed for the resultant structure in a nitrogen atmosphere at a temperature of 950° C. Thus, the arsenic ion injected layer 217A and the phosphorus ion injected layer 227A are activated. As a result, a first N⁺ type diffusion layer 217 and an N type diffusion layer 227 are formed. With the N⁺ type diffusion layer 217 and the N type diffusion layer 227, a source region 207ab and so forth are formed. The junction depth of the N⁺ type diffusion layer 217 is approximately 0.25 µm. The overlap width of the N⁺ type diffusion layer 217 and the floating gate electrode 204 through the gate oxide film 203 is approximately 0.2 µm. The junction depth of the N type diffusion layer 227 is approximately 0.4 µm. The overlap width of the N type diffusion layer 227 and the floating gate electrode 204 through the gate oxide film 203 is approximately 0.25 µm. In other words, the junction surface of the N⁺ type diffusion layer 217 is covered by the N type diffusion layer 227 (see FIGS. 3d, 1, and 2a).

A second photoresist film pattern 248 with a thickness of approximately 1.0 µm is formed. The second photoresist film pattern 248 covers at least the source region 207ab and so forth. The second photoresist film pattern 248 has an opening portion at a drain forming region. Arsenic ions of $3\times10^{15}$ cm$^{-2}$ are injected nearly in parallel with the normal of the front surface of the P type silicon substrate 201 with a mask of the photoresist film pattern 248 at 40 KeV. Thus, a second arsenic ion injected layer 218 is formed in the P type silicon substrate 201. In addition, boron ions of $8\times10^{13}$ cm$^{-2}$ are injected at an angle of, for example 45°, against the normal of the front surface of the P type silicon substrate 201 with the mask of the photoresist film pattern 248 at 50 KeV. Thus, a boron ion injected layer 219 is formed in the P type silicon substrate 201 (see FIG. 4a).

After the photoresist film pattern 248 is removed, a second heating process is performed for the resultant structure in a nitrogen atmosphere at a temperature of 900° C. for approximately 30 minutes. Thus, the arsenic ion injected layer 218 and the boron ion injected layer 219 are activated. As a result, drain region 208 and P⁻ type diffusion layer 209 composed of the second N⁺ type diffusion layer are formed. The junction depth of the drain region 208 is approximately 0.18 µm. The overlap width of the drain region 208 and the floating gate electrode 204 through the gate oxide film 203 is approximately 0.1 µm. The junction depth of the P⁻ type diffusion layer 209 is approximately 0.33 µm. The overlap width of the P⁻ type diffusion layer 209 and the floating gate electrode 204 through the gate oxide film 203 is approximately 0.23 μm. In other words, the junction surface of the drain region 208 is covered by the P⁻ type diffusion layer 209 (see FIGS. 4b, 1, and 2a).

An inter-layer insulation film 210 with a thickness of approximately 0.8 μm is formed on the entire surface of the resultant structure. The inter-layer insulation film 210 is composed of a BPSG film. Bit contact holes 211a, 211b and so forth that reach the drain region 208 are formed. The area of each of the bit contact hole 211a is 0.6 μm². A metal film of aluminum or its alloy thereof with a thickness of 0.9 μm is formed on the entire surface of the resultant structure. The metal film is patterned to form bit lines 212a, 212b (see FIGS. 1, 2a and 2b).

However, in recent years, as flash memories with high performance are desired, erase time should be reduced. In conventional flash memories, after approximately 100 cycles of write and erase operations are repeatedly performed, the erase time is approximately 0.4 sec. To shorten the erase time, the erase voltage rises from approximately 8V to 9.2V. To improve the performance of the flash memories, the size of the memory cells should be reduced. The sizes of the N⁺ type diffusion layer 217 and the N type diffusion layer 227 that compose the source region 207ab and so forth should be reduced.

For this end, the temperature of the first heating process should be lowered. In fabrication of conventional flash memories, when the heating process is performed at 900° C. instead of 950° C., the junction withstand voltage of the source region 207ab and so forth becomes approximately 9.6V. In such a heating process, the overlap width of the N type diffusion layer 227 and the floating gate electrode 204 is narrower than the overlap width of the N⁺ type diffusion layer 217 and the floating gate electrode 204. The junction withstand voltage of the source region 207ab and so forth is a minimum at the edge portion of the channel region just below the floating gate electrode 204. Thus, even if the data erase operation is performed for a particular memory cell at for example $V_{SS}$=8V, electrons are removed with the FN current. In addition, since hot carriers take place and holes enter the floating gate electrode 204, electrons are excessively removed. Thus, data cannot be written to memory cells corresponding to a bit line connected to the particular memory line.

To form the N type diffusion layer 227, ions are injected in parallel with the normal of the front surface of the P type silicon substrate 201. Although ions may be injected by an inclined rotating ion injecting method, the effective channel length of the memory cell resulting therefrom becomes too short. In addition, on a side surface of the source region 207ab of the floating gate electrode 204, an N⁺ type diffusion layer is locally formed. Thus, erase characteristics deviate for each memory cell. Instead of the N type diffusion layer 227, an N⁻ type diffusion layer may be formed by the inclined rotating ion injecting method. In this case, when the length of the effective channel is not too short, the junction withstand voltage of the source region cannot be sufficiently raised. In other words, the size of the memory cells should be reduced so as to accomplish high performance of the flash memories. However, unlike with the other semiconductor cells, erase time cannot be shortened only by reducing the size of the memory cells.

Another prior art device disclosed in JPA Hei 1-283880 will be briefly described with reference to FIG. 6, which comprises a semiconductor substrate 301, first gate insulating layer 304, floating gate electrode 305, second gate insulating layer 306, control gate electrode 307, source region 310, drain region 311. In this prior art device, as can be seen from FIG. 6, an N⁻ layer 315 is formed in an N⁺ layer near one end of the floating gate electrode 305. It seems that the overlap width of the floating gate electrode 5 and the N⁺ layer is larger than the overlap width of the floating gate and the N⁻ layer. However, the N⁻ layer is formed by injecting opposite conductivity type boron ions in the N⁺ layer. Thus, it is very difficult to control the accuracy of the boron ions injected and the diffusion speed of boron ions. Consequently, it is difficult to control the width of the N⁺ layer. As a result, it is difficult to control the overlap width of the floating gate and the N⁻ layer so that it is larger than the overlap width of the floating gate and the N⁺ layer. Occasionally, boron ions may be excessively injected to the N⁺ layer and thereby the N⁺ layer may be lost. Thus, it is very difficult to control source junction withstand voltage and erase characteristics.

SUMMARY OF THE INVENTION

An object of the present invention is to provide a flash memory having source-erase type memory cells for allowing erase time to be shortened without sacrificing of erase function and erase performance.

Another object of the present invention is to provide a method of fabricating of the memory cell mentioned as above.

According to the present invention, there is provided a non-volatile semiconductor memory cell, comprising:

a floating gate electrode formed on a front surface of a P type silicon substrate through a gate oxide film;

a control gate electrode formed on a front surface of said floating gate electrode through a gate insulation film, said control gate electrode working as a word line;

a source region including:

a first N⁺ type diffusion layer having a first junction depth and formed on the front surface of the P type silicon substrate, an N type diffusion layer having a second junction depth larger than the first junction depth, the N type diffusion layer being connected to the N⁺ type diffusion layer and formed on the front surface of the P type silicon substrate, and an N⁻ type diffusion layer formed just below said floating gate electrode through the gate oxide film, the width of said N⁻ type diffusion layer being larger than each of the N⁺ type diffusion layer and the N type diffusion layer, the N⁻ type diffusion layer having a junction depth smaller than at least the second junction depth, the N⁻ type diffusion layer being connected to the N⁺ type diffusion layer and formed on the front surface of the P type silicon substrate; and a memory cell including:

a second N⁺ type diffusion layer having a junction depth smaller than the first junction depth and formed on the front surface of the P type silicon substrate, and a drain region connected to a bit line.

The non-volatile semiconductor memory cell preferably includes a P⁻ type diffusion layer formed on the front surface of the P type silicon substrate and adapted for covering the junction surface of the second N⁺ type diffusion layer.

The present invention also provides a fabrication method of a non-volatile semiconductor memory cell, comprising the steps of:

forming a field oxide film at a device separating region on the front surface of a P type silicon substrate, forming a gate oxide film at a device region on the front surface of the P type silicon substrate by a heat oxidizing process, forming an N type polycrystalline silicon film with a predetermined impurity concentration on the entire surface of the resultant structure, patterning the polycrystalline silicon film so as to form a predetermined polycrystalline silicon film pattern, forming a gate insulation film on the entire surface of the resultant structure, forming a conductive film on the entire surface of the resultant structure, and patterning the conductive film, the gate insulation film, and the polycrystalline silicon pattern in succession so as to form a control gate electrode composed of the conductive film and a floating gate electrode composed of the crystal silicon film pattern;

forming a first photoresist film pattern for covering at least a drain forming region, the first photoresist film pattern having an opening portion at a source forming region;

injecting arsenic ions of a first injecting amount at a first injecting energy level in parallel with the normal of the front surface of the P type silicon substrate with a mask of the first photoresist film pattern so as to form a first arsenic ion injected layer in the P type silicon substrate;

injecting phosphorus ions of a second injecting amount that is much smaller than the first injecting amount at a second injecting energy level that is smaller than the first injecting energy level at a predetermined angle relative to the normal of the front surface of the P type silicon substrate with the mask of the first photoresist film pattern by an inclined rotating ion injecting process so as to form a second phosphorus ion injected layer in the P type silicon substrate;

injecting phosphorus ions of a third injecting amount that is larger than the first injecting amount and the second injecting amount at a third injecting energy level larger than the first injecting energy level and the second injecting energy level in parallel with the normal of the front surface of the P type silicon substrate with the mask of the first photoresist film pattern so as to form a second phosphorus ion injected layer in the P type silicon substrate;

removing the first photoresist film pattern and performing a first heating process at a predetermined temperature so as to form a source region on the front surface of the P type silicon substrate, the source region including a first $N^+$ type diffusion layer, an $N^-$ type diffusion layer, and an N type diffusion layer, the first $N^+$ type diffusion layer being formed by activating the first arsenic ion injected layer, the $N^-$ type diffusion layer being formed by activating the first phosphorus ion injected layer, the N type diffusion layer being formed by activating the second phosphorus ion injected layer;

covering at least the source region so as to form a second photoresist film pattern having an opening portion at the drain forming region;

injecting arsenic ions of a fourth injecting amount smaller than the first injecting amount and larger than the fourth injecting amount at a fourth injecting energy level in parallel with the normal of the front surface of the P type silicon substrate with a mask of the second photoresist film pattern so as to form a second arsenic ion injected layer in the P type silicon substrate;

removing the second photoresist film pattern and performing a second heating process at a temperature lower than the predetermined temperature so as to form a drain region composed of a second $N^+$ type diffusion layer formed by activating the second arsenic ion injecting layer; and forming an inter-layer insulation film on the entire surface of the resultant structure, forming a bit contact hole that reaches the drain region in the inter-layer insulation film, and forming a bit line connected to the drain region through the bit contact hole on the front surface of the inter-layer insulation film.

Preferably, the fabrication method includes the steps of injecting boron ions of a fifth injecting amount at a fifth injecting energy level at a predetermined angle to the normal of the front surface of the P type silicon substrate with the mask of the second photoresist film pattern by an inclined rotating ion injecting process so as to form a boron ion injected layer in the P type silicon substrate, and forming a $P^-$ type diffusion layer for covering the junction surface of the second $N^+$ type diffusion layer on the front surface of the P type silicon substrate when the second $N^+$ type diffusion layer is formed by the second heating process.

According to the prior art disclosed in JPA Sho 64-81272 above, to increase the current capacity in the data erase state and raise the junction withstand voltage of the source region, the source region is composed of both an $N^-$ layer and an $N^+$ layer that is surrounded by the $N^-$ layer. Arsenic ions and phosphorus ions are vertically injected in the structure with the same mask. Thus, depending on the heating process conducted, the overlap width of the floating gate and the $N^+$ layer becomes larger than the overlap width of the floating gate and the $N^-$ layer. Consequently, since the source junction withstand voltage at the channel edge portion becomes low, data is excessively erased.

According to the present invention, the overlap width of the floating gate and the $N^-$ layer is intentionally increased in comparison with the overlap width of the floating gate and the $N^+$ layer so as to raise the source junction withstand voltage. The $N^+$ layer is formed by a vertical ion injecting method. The $N^-$ layer is formed by an inclined ion injecting method. To increase the overlap length of the floating gate and the $N^-$ layer in comparison with the overlap length of the floating gate and the $N^+$ layer, a shallow $N^-$ layer (127, 137) with a low concentration is formed inside the $N^-$ layer. Thus, the source junction withstand voltage is further increased.

In addition, according to the present invention, since the overlap widths are intentionally controlled, the source junction withstand voltage and the erase characteristics can be easily controlled. Moreover, since both the vertical ion injecting method and the inclined ion injecting method are used, the number of fabrication steps can be decreased. Furthermore, the deviation of the final products is small. Thus, the present invention is superior to the prior art even in fabrication.

These and other objects, features and advantages of the present invention will become more apparent in light of the following detailed description of a best mode embodiment thereof, as illustrated in the accompanying drawings.

DESCRIPTION OF THE PREFERRED EMBODIMENT

The present invention will be described in more detail with reference to the accompanying drawings.

Figure 1:
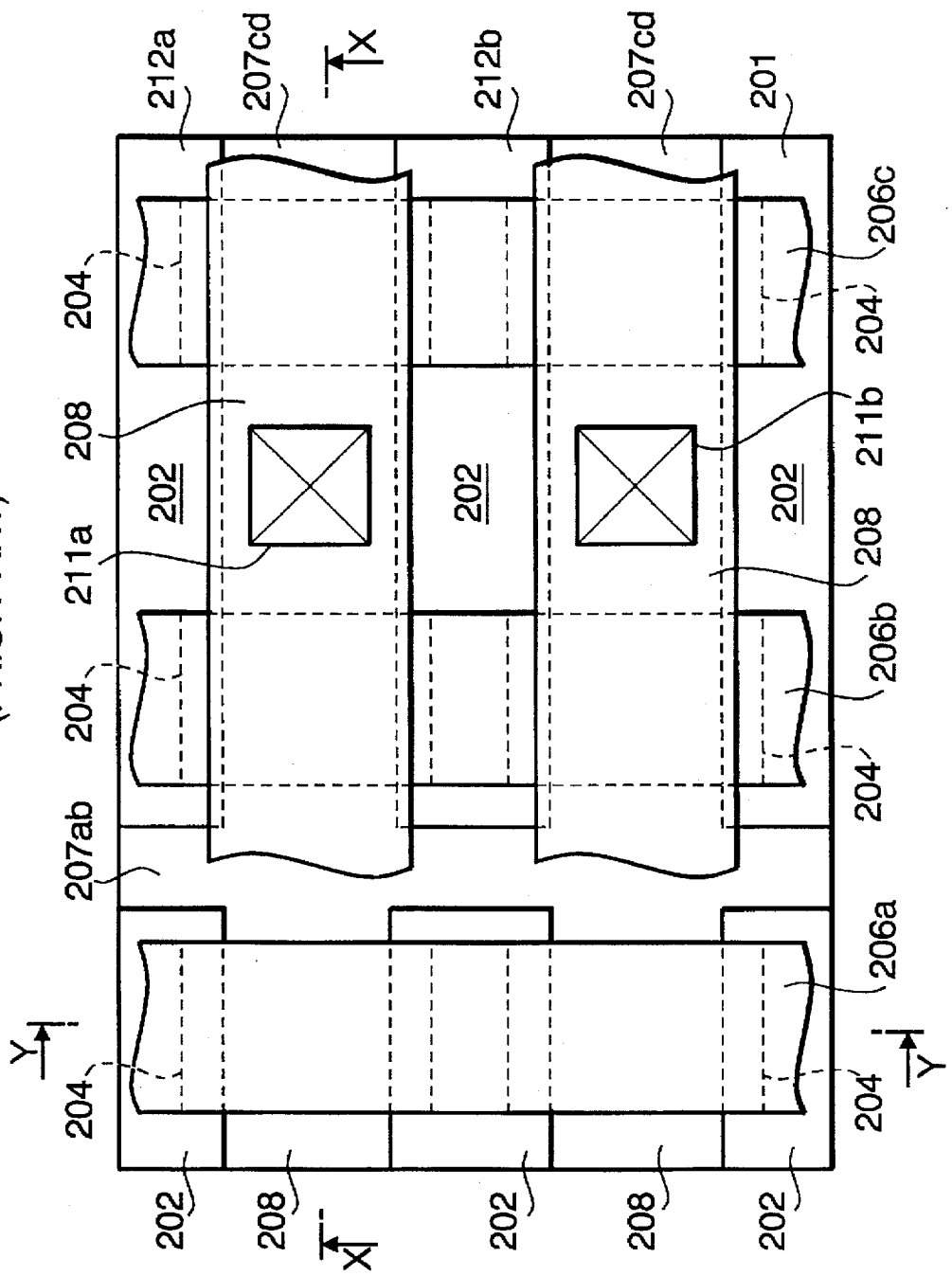
FIG. 1 is a schematic plan view showing a conventional flash memory.
Figure 2A:
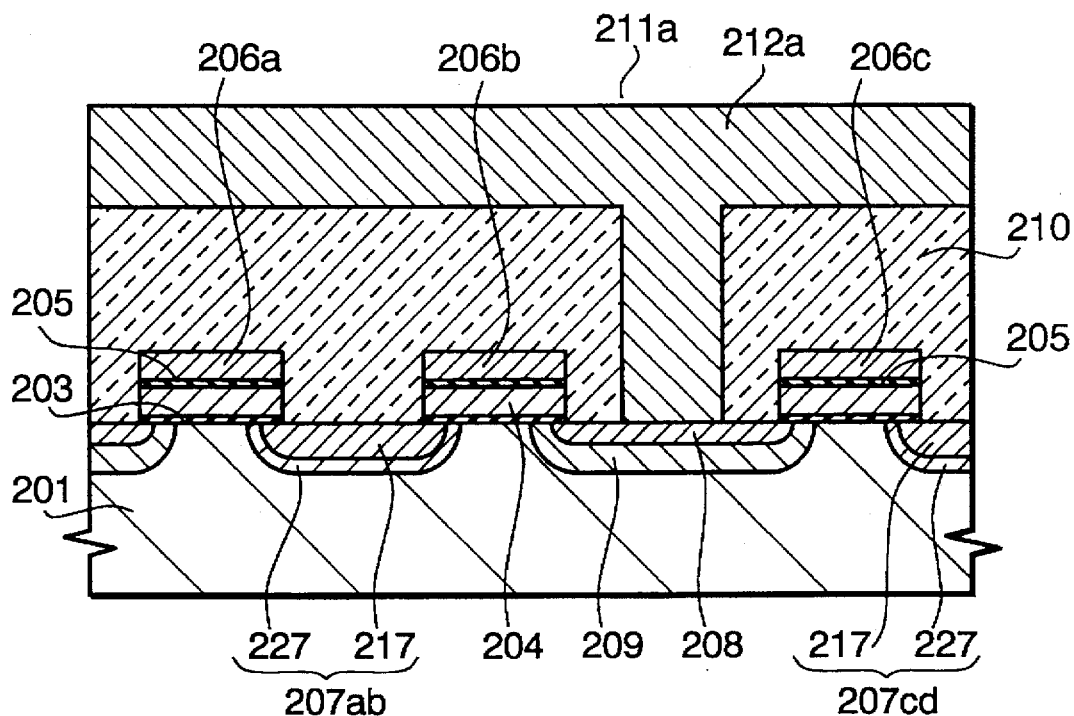
FIG. 2a is a cross-sectional view taken along line X—X in FIG. 1.
Figure 2B:
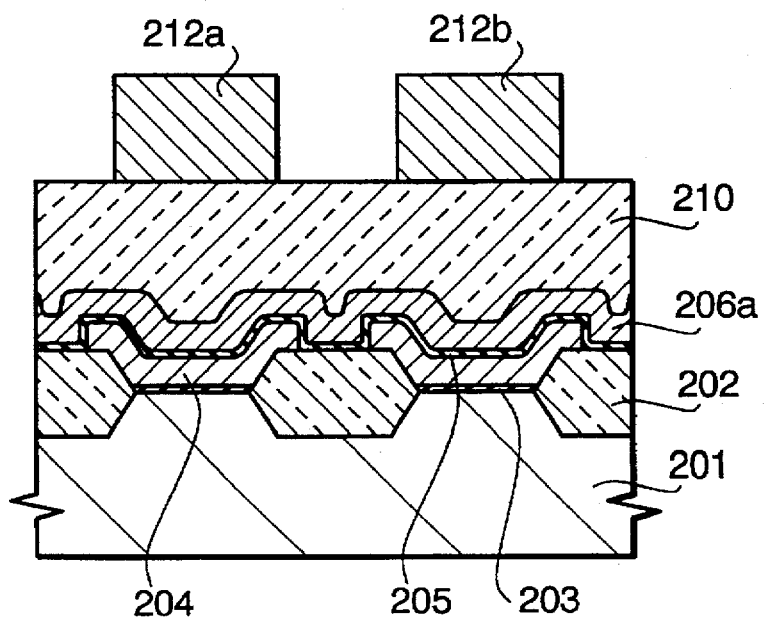
FIG. 2b is a cross-sectional view taken along line Y—Y in FIG. 1.
Figure 3A:
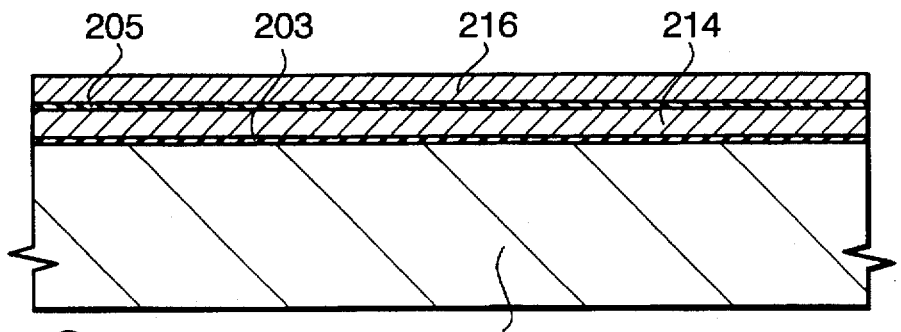
FIGS. 3a to 3d are cross-sectional views taken along line X—X in FIG. 1 for explaining fabrication steps of the conventional flash memory.
Figure 3B:
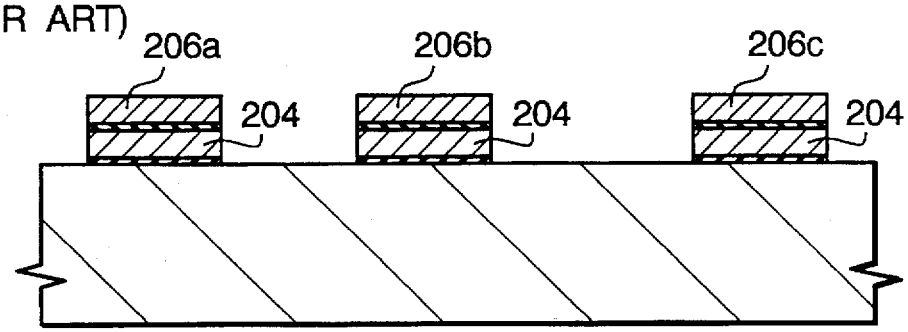
Figure 3C:
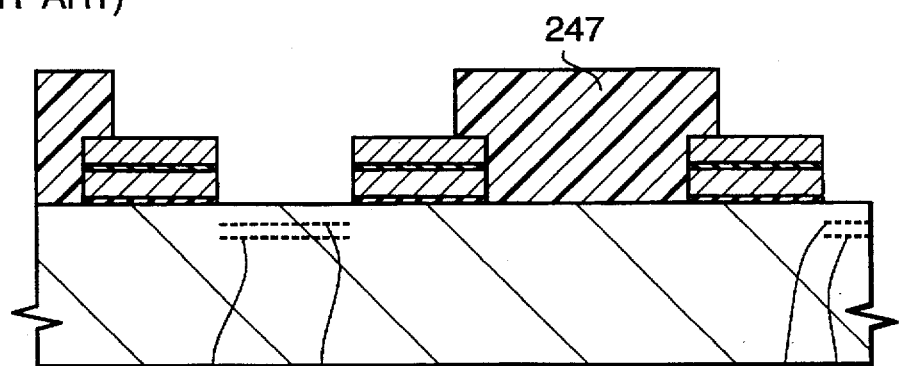
Figure 3D:
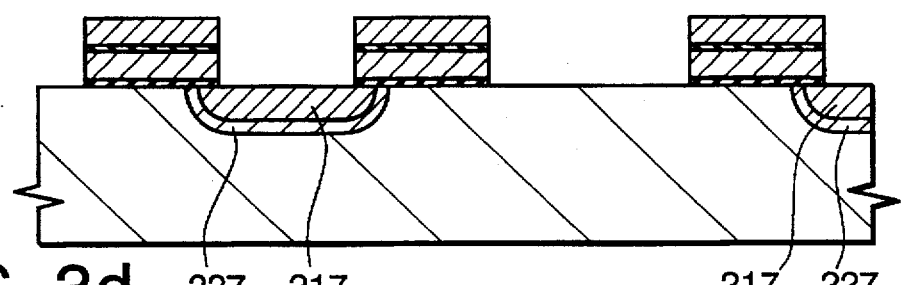
Figure 4A:
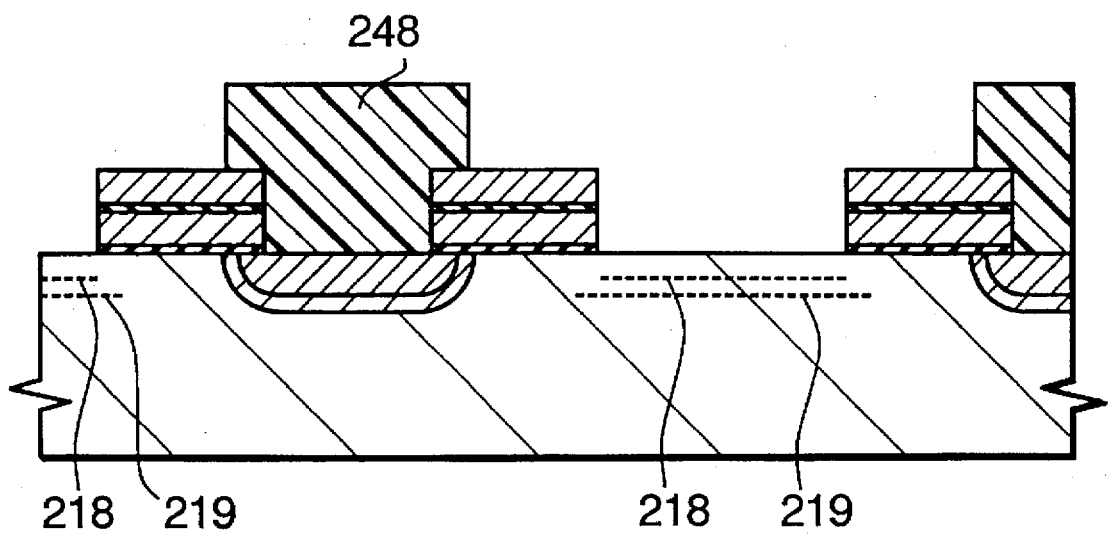
FIGS. 4a and 4b are cross-sectional views taken along line X—X in FIG. 1 for explaining fabrication steps of the conventional flash memory.
Figure 4B:
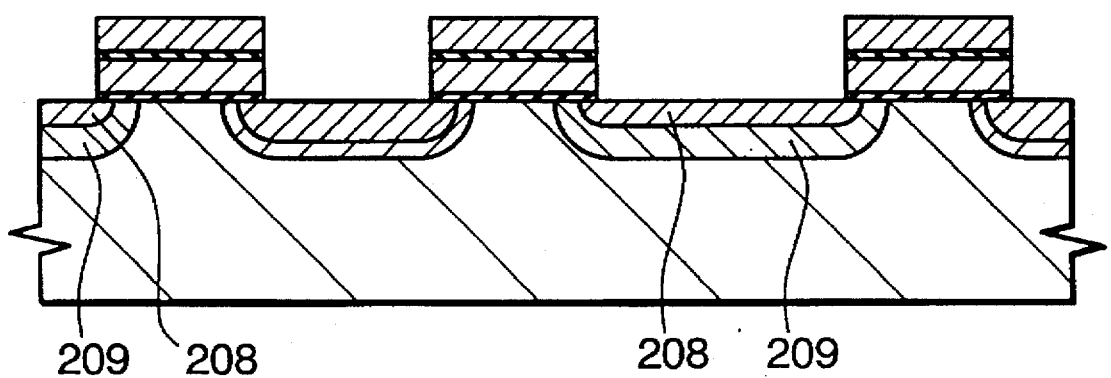
Figure 5A:
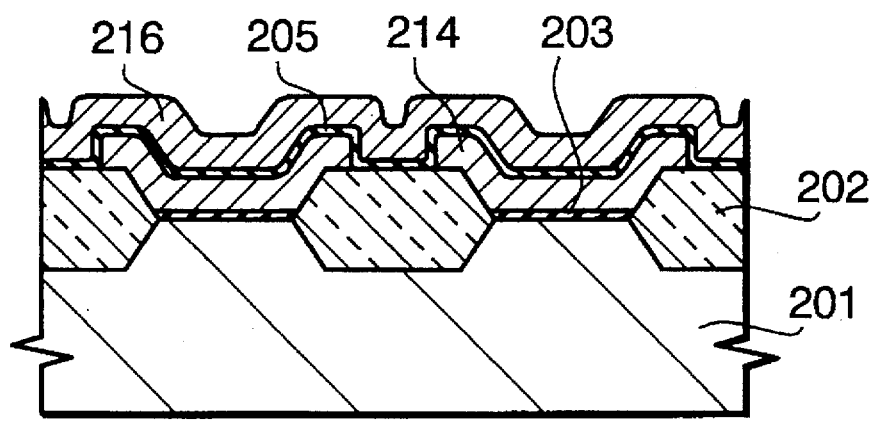
FIGS. 5a and 5b are cross-sectional views taken along line Y—Y in FIG. 1 for explaining fabrication steps of the conventional flash memory.
Figure 5B:
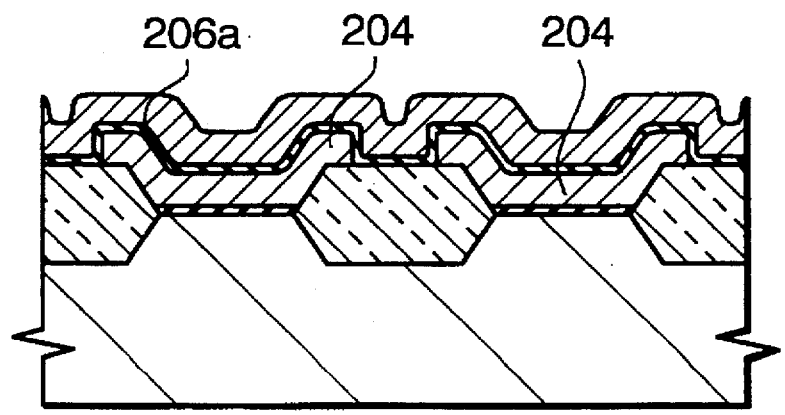
Figure 6:
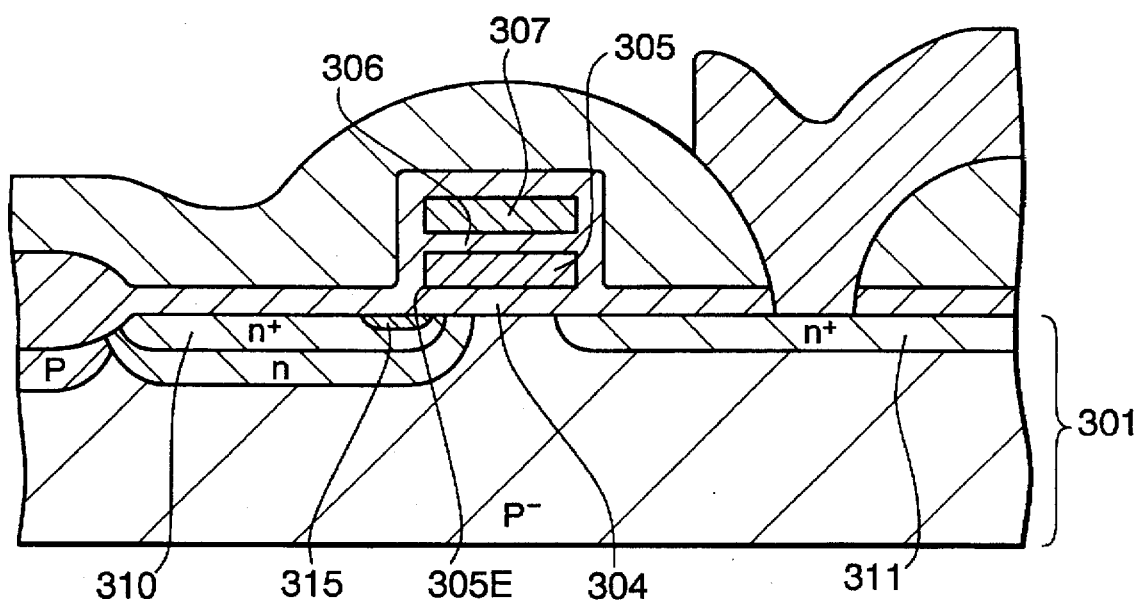
FIG. 6 is a cross-sectional view showing another conventional flash memory.
Figure 7:
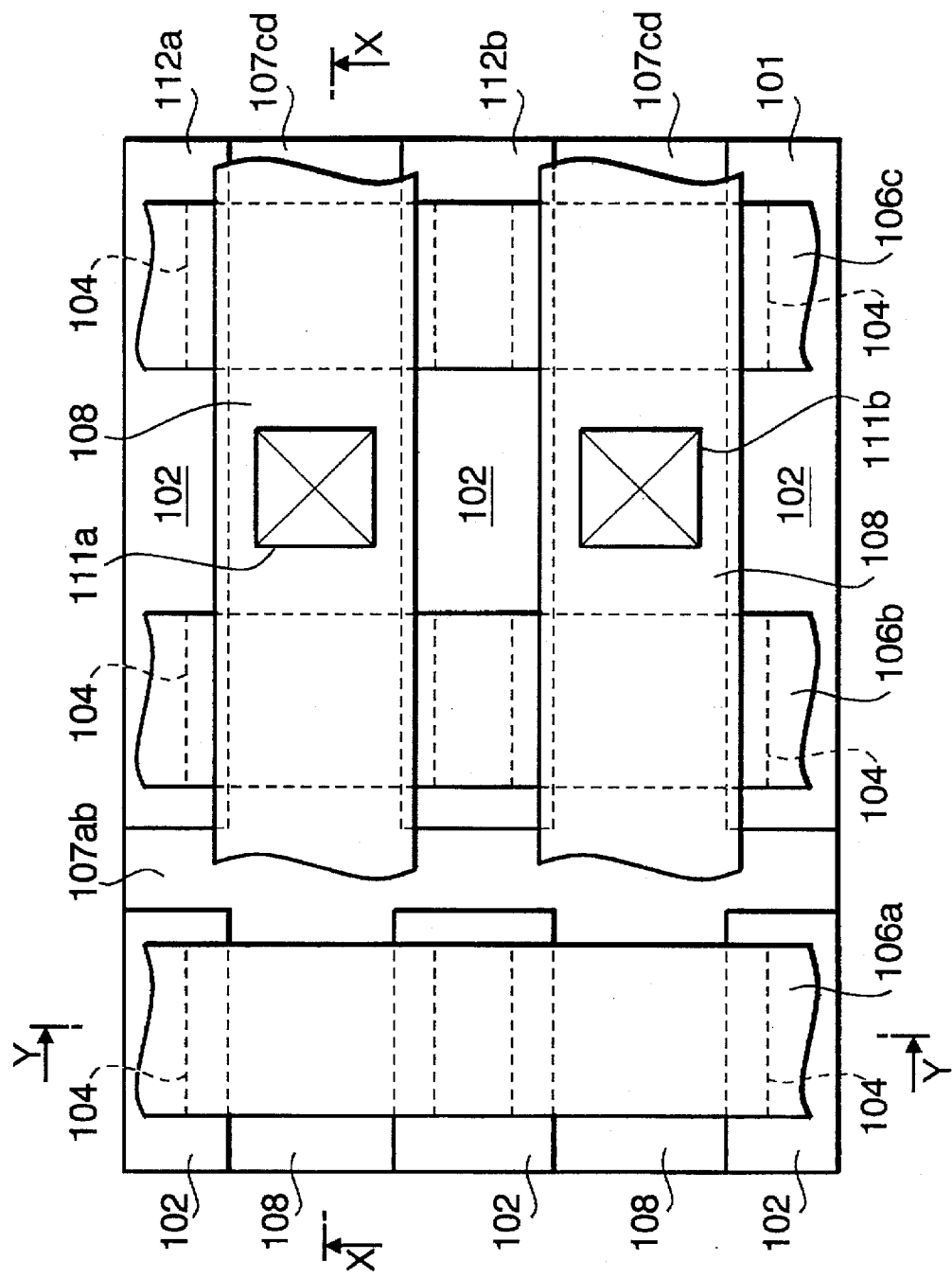
FIG. 7 is a schematic plan view showing a non-volatile semiconductor memory cell embodying the present invention.
Figure 8A:
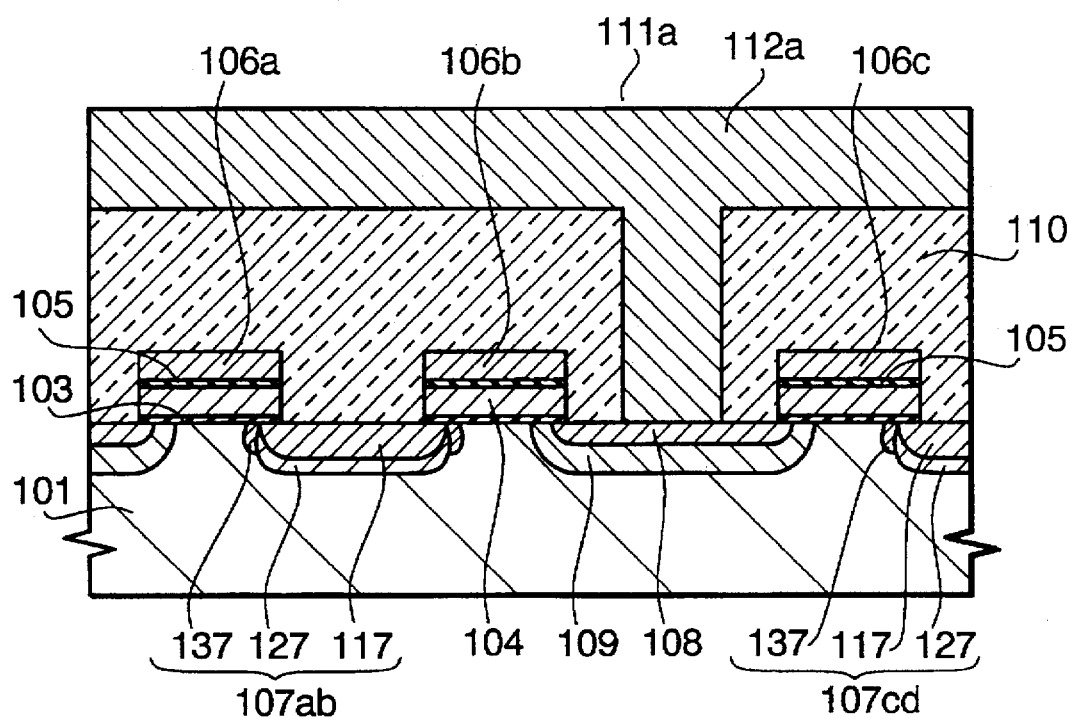
FIG. 8a is a cross-sectional view taken along line X—X shown in FIG. 7.
Figure 8B:
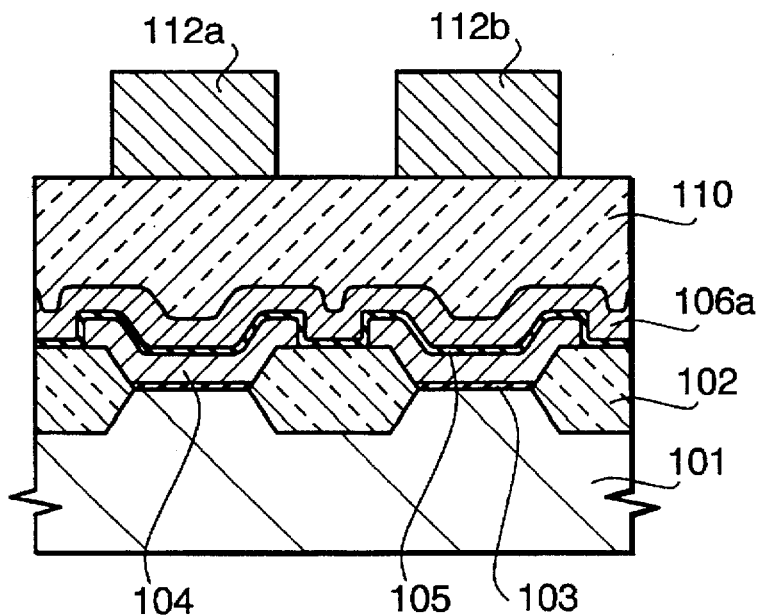
FIG. 8b is a cross-sectional view taken along line Y—Y in FIG. 7.
Figure 9A:
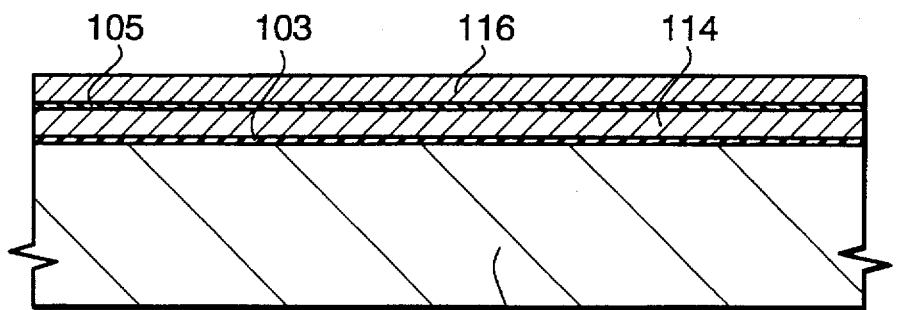
FIGS. 9a to 9d are cross-sectional views taken along line X—X in FIG. 7 for explaining fabrication steps according to the embodiment of the present invention.
Figure 9B:
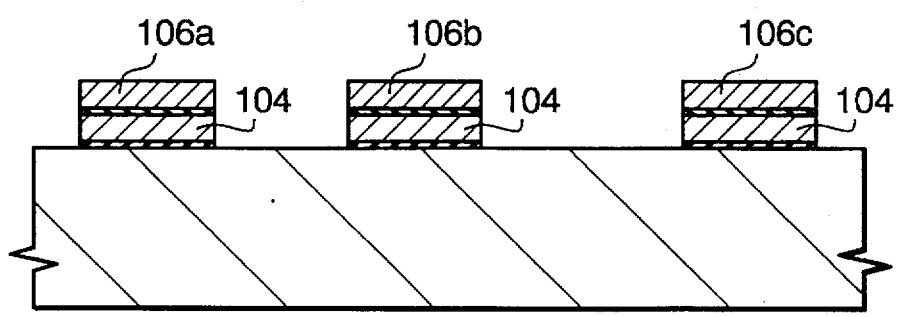
Figure 9C:
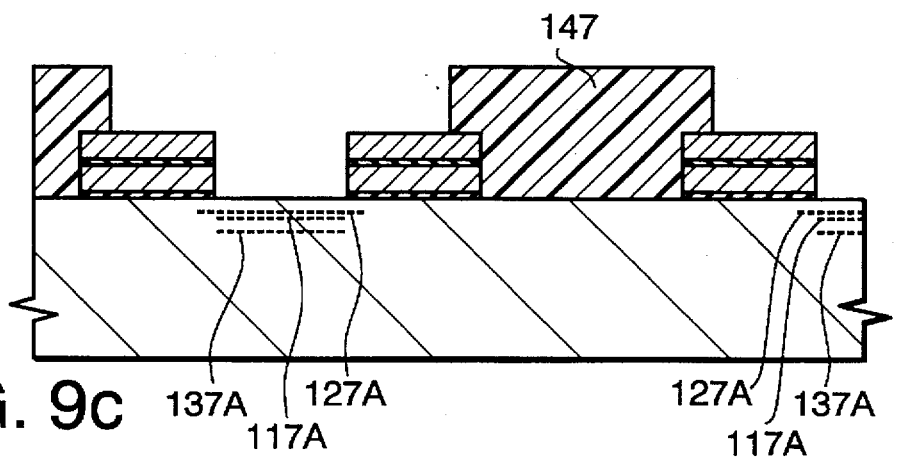
Figure 9D:
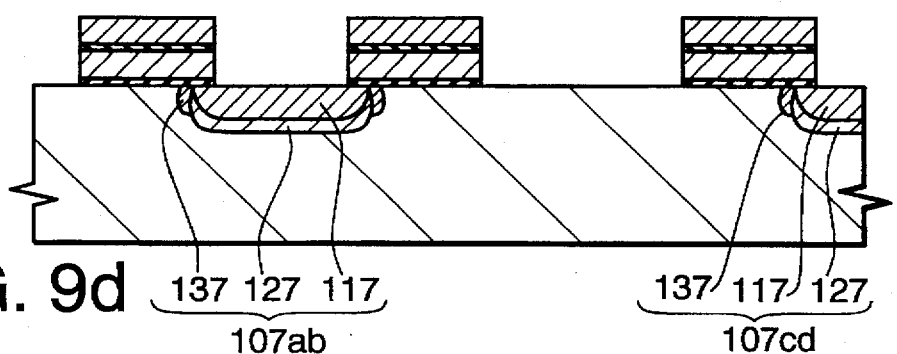
Figure 10A:
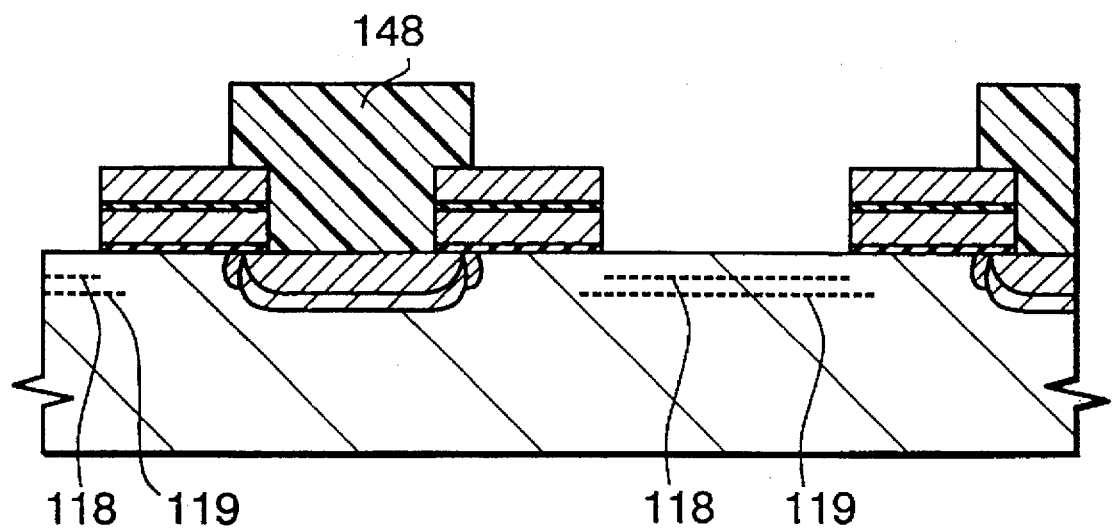
FIGS. 10a and 10b are cross-sectional views taken along line X—X in FIG. 7 for explaining fabrication steps according to the embodiment of the present invention.
Figure 10B:
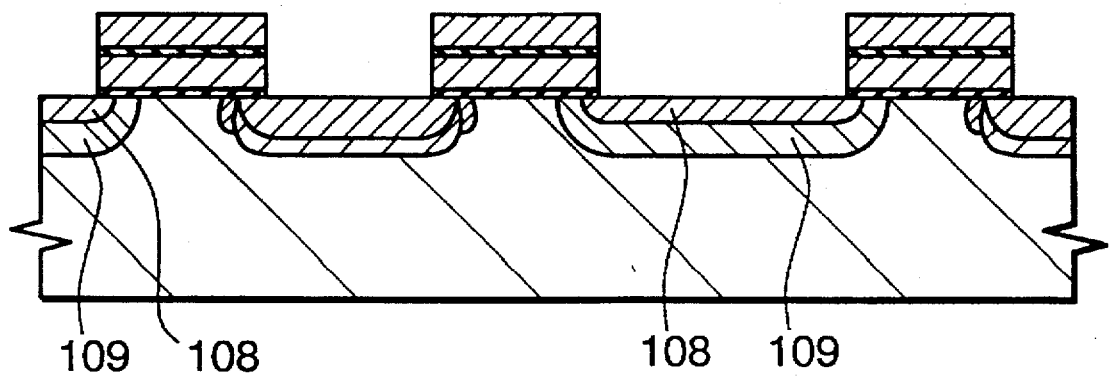

FIG. 7 is a schematic plan view showing a flash memory according to the present invention. FIG. 8a is a cross-sectional view taken along line X—X in FIG. 7, and FIG. 8b is a cross-sectional view taken along line Y—Y in FIG. 7. The flash memory according to the embodiment of the present invention has stacked-gate, source-erase type memory cells formed corresponding to 0.4 μm design rule. Next, the structure of the flash memory according to this embodiment of the present invention will be described.

A P type silicon substrate 101 has a face orientation of (100). The surface impurity concentration of the P type silicon substrate 101 is approximately $2 \times 10^{17}$ cm$^{-3}$. The P type silicon substrate 101 has a plurality of device separating regions. In the device separating regions, a field oxide film 102 is formed for a thickness of approximately 0.6 μm. Moreover, in the device separating regions, stacked-gate type memory cells are formed. Each of the memory cells is composed of a gate oxide film 103, floating gate electrode 104, gate insulation film 105, control gate electrodes 106a, 106b, 106c and so forth, source regions 107ab and 107cd and so forth, and drain region 108. The gate oxide film 103 is formed on the P type silicon substrate 101. The thickness of the gate oxide film 103 is approximately 10 nm. The floating gate electrode 104 is formed on the front surface of the P type silicon substrate 101 through the gate oxide film 103. The floating gate electrode 104 is composed of an N type polycrystalline silicon film whose impurity concentration is approximately $1 \times 10^{19}$ cm$^{-3}$ and whose thickness is approximately 150 nm. The gate insulation film 105 is formed on the front surface of the floating gate electrode 104. The gate electrode 104 is a layer laminate of an oxide silicon film with a thickness of approximately 7 nm, silicon nitride film with a thickness of approximately 10 nm, and silicon oxide film with a thickness of approximately 3 nm. The control gate electrodes 106a, 106b, 106c and so forth are formed on the floating gate electrode 104 through the gate insulation film 105. The control gate electrodes 106a, 106b, 106c and so forth also function as word lines. The control gate electrodes 106a, 106b, 106c and so forth are composed of a $N^+$ type polycrystalline silicon film with a thickness of approximately 150 nm. The source regions 107ab, 107cd and so forth are formed on the front surface of the P type silicon substrate 101. The drain region 108 is formed on the front surface of the P type silicon substrate 101. The distance between the control gate electrode 106a and the control gate 106b is 0.8 μm. The distance between the control gate electrode 106b and the control gate electrode 106c is 1.2 μm. Each memory cell has one floating gate electrode 104. The gate length and gate width of the memory cell are for example 0.8 μm and 0.8 μm, respectively.

The drain region 108 is composed of a second $N^+$ type diffusion layer that is self-aligned to, for example, control gate electrodes 106b and 106c, floating gate electrode 106, and field oxide film 102. The junction depth of the drain region 108 is approximately 0.15 μm. The overlap width of the floating gate electrode 104 and the drain region 108 through the gate oxide film 103 is approximately 0.08 μm. The junction surface of the drain region 108 is covered with a $P^-$ type diffusion layer 109 formed on the front surface of the P type silicon substrate 101. The $P^-$ type diffusion layer 109 is more deeply formed than the drain region 108 by approximately 0.3 μm. The overlap width of the floating gate electrode 104 and the $P^-$ type diffusion region 109 through the gate oxide film 103 is approximately 0.1 μm. One drain region 108 is shared by two memory cells. The drain region 108 is connected to bit lines 112a, 112b and so forth through bit contact holes 111a, 111b and so forth, formed in an inter-layer insulation film 110 that covers the memory cells. The area of each bit contact holes 111a, 11b and so forth is 0.4 μm$^{-2}$. The bit lines 112a, 112b and so forth are formed perpendicular to the control gate electrodes 106a, 106b, 106c and so forth through the inter-layer insulation film 110. In this embodiment, although the $P^-$ type diffusion layer 109 is formed, it is not essential.

The source regions 107ab, 107cd and so forth are composed of a first $N^+$ type diffusion layer 117, $N^-$ type diffusion layer 127, and N type diffusion layer 127. The junction depth of the $N^+$ type diffusion layer 117 is approximately 0.18 μm and is larger than the junction depth of the second $N^+$ type diffusion layer that composes the drain region 108. The overlap width of the floating gate electrode 104 and the $N^+$type diffusion layer 117 through the gate oxide film 103 is approximately 0.15 μm. The impurity concentration of the $N^-$ type diffusion layer 127 is approximately $7 \times 10^{18}$ cm$^{-3}$. The overlap width of the floating gate electrode 104 and the $N^-$ type diffusion layer 127 through the gate oxide film 103 is approximately 0.2 μm and is larger than the overlap width of the floating gate electrode 104 and the $N^+$ type diffusion layer 117 through the gate oxide film 103. The impurity concentration of the N type diffusion layer 137 is approximately $3.3 \times 10^{19}$ cm$^{-3}$. The junction depth of the N type diffusion layer 137 is 0.3 μm and is larger than the junction depth of the $N^+$ type diffusion layer 117. The overlap width of the floating gate electrode 104 and the N⁻ type diffusion layer 137 through the gate oxide film 103 is the same as the overlap width of the floating gate electrode 104 and the N⁺ type diffusion layer 117 through the gate oxide film 103. For example, the source region 107ab is formed on the front surface of the P type silicon substrate 101 such that the source region 107ab is self-aligned to the control gate electrodes 106a and 106b, (the floating gate electrode 106), and the field oxide film 102. The source region 107ab is shared by a predetermined number of memory cells corresponding to the control gate electrodes 106a and 106b. The source region 107ab is connected to lines formed in parallel with the bit line 112a and so forth on the front surface of the inter-layer insulation film 110 through contact holes (not shown) formed in the inter-layer insulation film 110. The contact holes are formed at intervals of, for example, 16 bits.

Figure 11A:
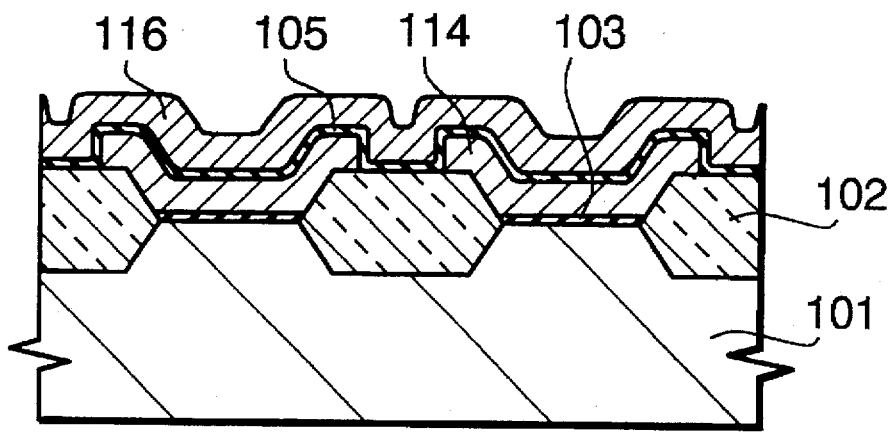
FIGS. 11a and 11b are cross-sectional views taken along line Y—Y in FIG. 7 for explaining fabrication steps according to the embodiment of the present invention.
Figure 11B:
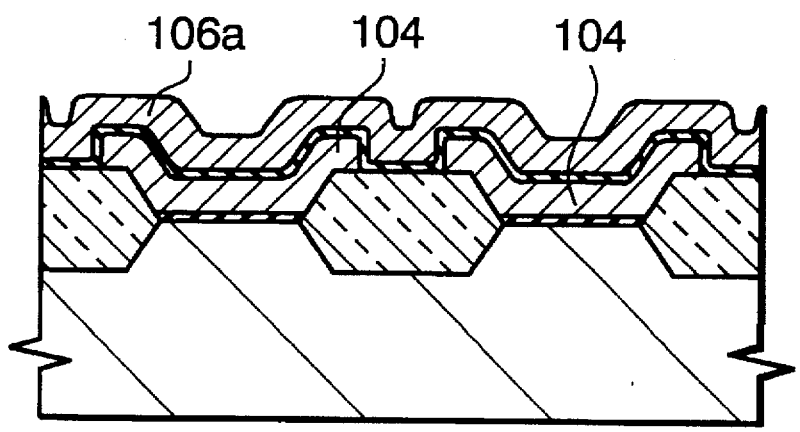

With reference to FIGS. 7, 8a, 8b, 9a to 9d, 10a, 10b, 11a, and 11b, the fabrication method of the flash memory according to the embodiment of the present invention will be described. FIGS. 9a to 9d, 10a and 10b are cross-sectional views taken along line X—X shown in FIG. 7 for explaining fabrication steps of the flash memory according to the embodiment. FIGS. 11a and 11b are cross-sectional views taken along line Y—Y shown in FIG. 7 for explaining the fabrication steps of the flash memory according to this embodiment.

A field oxide film 102 is formed in a device separating region on the front surface of a P type silicon substrate 101. A gate oxide film 103 is formed in a device forming region on the front surface of the P type silicon substrate 101 by a heat oxidizing process. An N type polycrystalline silicon film is formed on the entire surface of the resultant structure. The polycrystalline silicon film is patterned in a stripe shape in parallel with bit lines. Thus, a polycrystalline silicon film pattern 114 is formed. Thereafter, a gate insulation film 105 with a thickness of 20 nm is formed on the entire surface of the resultant structure. The gate insulation film 105 is formed in the following manner. A silicon oxide film (not shown) with a thickness of approximately 7 nm and a silicon nitride film (not shown) are formed on the entire surface of the resultant structure by high temperature vapor phase growing and reduced pressure vapor phase growing methods, respectively. Thereafter, a silicon nitride film with a thickness of approximately 10 nm is formed by a heat oxidizing process. Next, a silicon oxide film (not shown) with a thickness of approximately 3 nm is formed on the silicon nitride film. Then, an N⁺ type polycrystalline silicon film 116 is formed on the entire surface of the resultant structure (see FIGS. 9a and 11a).

Thereafter, a polycrystalline silicon film 116, the gate insulation film 105, and the polycrystalline silicon film pattern 114 are successively patterned. Thus, control gate electrodes 106a, 106b, 106c and so forth (composed of the polycrystalline silicon film 116) and a floating gate electrode 104 (composed of the polycrystalline silicon film pattern 116) are formed (see FIGS. 9b, 11b, and 7). Thereafter, a silicon oxide film (not shown) with a thickness of approximately 10 to 20 nm is formed on the exposed surfaces of the control gate electrodes 106a, 106b, 106c and so forth, the floating gate electrode 104 and the front surface of the P type silicon substrate 101 by the heat oxidizing process. In the embodiment, the control gate electrode 106a and so forth are formed with material of the N⁺ type polycrystalline silicon film 116. However, the material of the control gate electrode 106a and so forth is not limited to the N⁺ type polycrystalline silicon film 116. Instead, the control gate electrode 106a may be composed of a polycide film or silicide film.

A first photoresist film pattern 147 with a thickness of approximately 1.0 µm is formed. The first photoresist film pattern 147 covers at least drain forming region. The first photoresist film pattern 147 has an opening portion at a source forming region. Arsenic ions of $5 \times 10^{15}$ $cm^{-2}$ are injected nearly in parallel with the normal of the front surface of the P type silicon substrate 101 with a mask of the photoresist film pattern 147 at 70 KeV. Thus, a first arsenic ion injected layer 117A is formed in the P type silicon substrate 101. Thereafter, phosphorus ions of $1 \times 10^{14}$ $cm^{-2}$ are injected at an angle of for example 45° to the normal of the front surface of the P type silicon substrate 101 with the mask of the photoresist film pattern 147 at 180 KeV. Thus, a first phosphorus ion injected layer 127A is formed in the P type silicon substrate 101. Thereafter, phosphorus ions of $1 \times 10^{15}$ $cm^{-2}$ are injected nearly in parallel with the normal of the front surface of the P type silicon substrate 101 with a mask of the photoresist film pattern 147 at 180 KeV. Thus, a second phosphorus ion injected layer 137A is formed in the P type silicon substrate 101 (see FIG. 9c). The order of the three ion injected layers is not important. In addition, since ions are injected with the mask of the photoresist film pattern 147 by the inclined rotating ion injecting method, the edge portion of the photoresist film pattern 147 of the control gate electrode 106a and so forth should be spaced apart from the source forming region as much as possible.

After the photoresist film pattern 147 is removed, a first heating process is performed for the resultant structure in a nitrogen atmosphere at a temperature of 900° C. Thus, the arsenic ion injected layer 117A, the phosphorus ion injected layer 127A, and the phosphorus ion injected layer 137A are activated. As a result, a first N⁺ type diffusion layer 117, an N⁻ type diffusion layer 127, and an N type diffusion layer 137 are formed. With the N⁺ type diffusion layer 117, the N⁻ type diffusion layer 127, and the N type diffusion layer 137, source region 107ab and so forth are formed (see FIGS. 9d, 7, and 8a).

A second photoresist film pattern 148 with a thickness of approximately 1.0 µm is formed. The second photoresist film pattern 148 covers at least the source region 107ab and so forth. The second photoresist film pattern 148 has an opening portion at a drain forming region. Arsenic ions of $3 \times 10^{15}$ $cm^{-2}$ are injected nearly in parallel with the normal of the front surface of the P type silicon substrate 101 with a mask of the photoresist film pattern 148, at 40 KeV. Thus, a second arsenic ion injected layer 118 is formed in the P type silicon substrate 101. In addition, boron ions of $8 \times 10^{13}$ $cm^{-2}$ are injected at an angle of, for example, 45° against the normal of the front surface of the P type silicon substrate 101, with the mask of the photoresist film pattern 148, at 50 KeV. Thus, a boron ion injected layer 119 is formed in the P type silicon substrate 101 (see FIG. 10a).

After the photoresist film pattern 148 is removed, a second heating process is performed for the resultant structure in a nitrogen atmosphere at a temperature of 850° C. for approximately 30 minutes. Thus, the arsenic ion injected layer 118 and the boron ion injected layer 119 are activated. As a result, drain region 108 and P⁻ type diffusion layer 109 composed of the second N⁺ type diffusion layer are formed. The junction surface of the drain region 108 is covered by the P⁻ type diffusion layer 109 (see FIGS. 10b, 7, and 8a).

An inter-layer insulation film 110 with a thickness of approximately 0.8 µm is formed on the entire surface of the resultant structure. The inter-layer insulation film 110 is composed of a BPSG film. When the control gate electrode 106a and so forth are not composed of the N⁺ type polycrystalline silicon film, a silicon oxide film with a predetermined thickness is preferably formed by the high temperature vapor phase growing method before the BPSG film is formed. Bit contact holes 111a, 111b and so forth that reach the drain region 108 are formed. An aluminum metal film with a thickness of 0.9 μm is formed on the entire surface of the resultant structure. The metal film is patterned and thereby bit lines 112a, 112b and so forth are formed (see FIGS. 7, 8b).

Data write operation for the memory cells according to the embodiment is performed in the same manner as that for the conventional memory cells. When data write operation is performed for only a memory cell corresponding to a bit line 112a and a control gate electrode 106b, when $V_{SS}=0V$, $V_{SUB}=0V$, $V_{DD}=5.2V$ for only the bit line 112a ($V_{DD}=0V$ for other bit line 112b and so forth), and $V_{CG}=12V$ for only the control gate electrode 206b ($V_{CG}=0V$ for other control gate electrode 106a and so forth), the threshold voltage of the memory cell becomes approximately 7V. In the memory cells according to this embodiment, the data erase operation is performed at $V_{SS}=9.2V$ rather than $V_{SS}=8V$ unlike with the conventional memory cells. However, as with the conventional memory cells, the minimum value and the maximum value of the erase threshold voltage of the memory cells according to the embodiment are set to 0.5V and 3.5V, respectively. The erase time is defined by a period of time in which the erase threshold voltage of all the memory cells of a 256 Kbit flash memory (including both the flash memory corresponding to this embodiment and the conventional flash memory) becomes 3.5V or less. The erase voltage is a pulse voltage with a time width of 10 msec. Thus, the erase time is obtained by multiplying the number of pulses by 10 msec.

Figure 12:
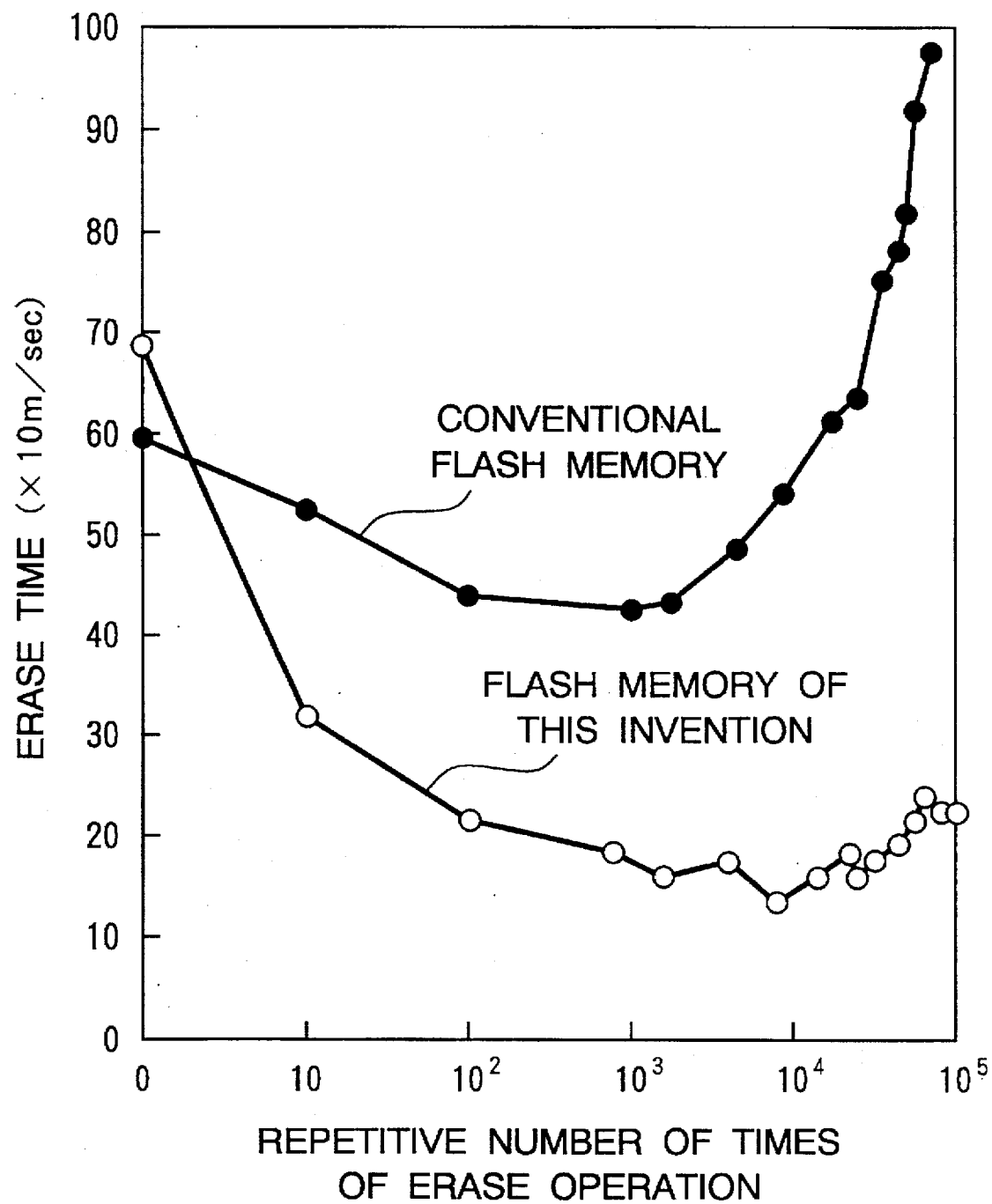
FIG. 12 is a graph showing dependency of the number of times of repetitive erase operations against erase time as an effect of the embodiment of the present invention.

FIG. 12 is a graph showing dependency of erase time versus the number of times of repetitive erase operations (the repetitive number of times of write/erase operations). Referring to FIG. 12, dependency for the flash memory according to this embodiment as well as that for the conventional flash memory is shown as being a "bathtub" shaped curve. The erase time of the conventional flash memory when the erase operation was performed approximately 100 times is approximately 0.4 sec. On the other hand, the erase time of the flash memory according to the embodiment under the same conditions is approximately 0.2 sec. Thus, the erase time of the flash memory according to the embodiment is half that of the conventional flash memory. In addition, referring to FIG. 12, the life of the flash memory according to this embodiment is longer than that of the conventional flash memory.

With reference to FIGS. 13a, 13b, 14a and 14b, the reason why the $N^-$ type diffusion layer 127 and the N type diffusion layer 137 are formed in the source region according to this embodiment will be described.

Figure 13A:
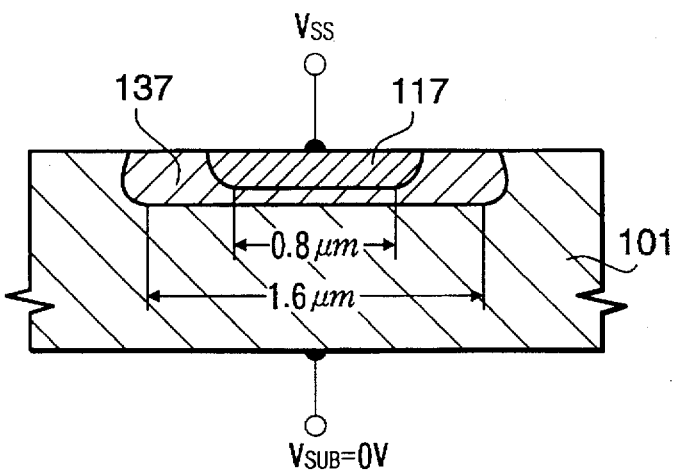
FIG. 13a is a cross-sectional view showing a TEG for measuring a junction withstand voltage of an N type diffusion layer that makes up a source region.
Figure 13B:
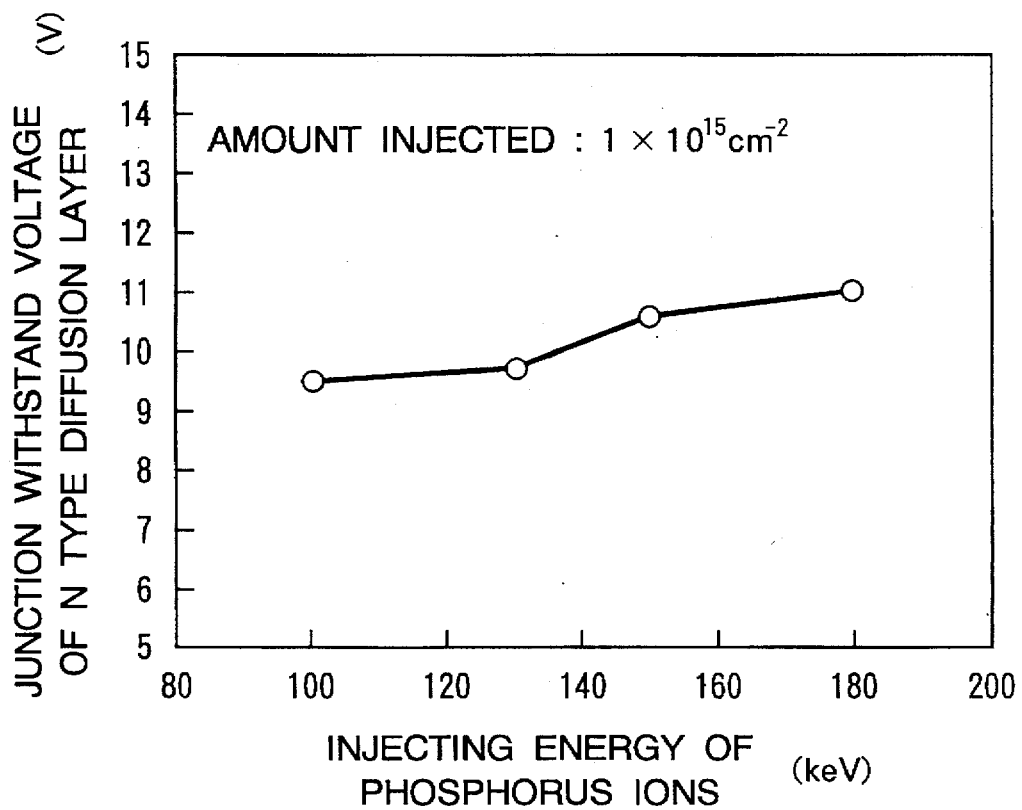
FIG. 13b is a graph showing dependency of ion injecting energy for forming an N type diffusion layer against a junction withstand voltage of an N type diffusion layer.

Considering the fluctuation of power supply voltage (7.8V to 10.2V), when the erase voltage ($V_{SS}-V_{SUB}$) is 9.2V, the junction withstand voltage of the source region 107ab and so forth is preferably higher than 10.2V. A TEG that has an N type diffusion layer 137 with a width of 1.6 μm and an $N^+$ type diffusion layer 117 with a width of 0.8 μm was formed. The junction withstand voltage of the N type diffusion layer 137 was measured. At that point, the amount of phosphorus ions injected for forming the N type diffusion layer 137 was fixed to $1\times10^{15}$ cm$^{-2}$. The injecting energy of the phosphorus ions was varied. FIG. 13a is a cross-sectional view showing the TEG. FIG. 13b is a graph showing dependency of the injecting energy versus junction withstand voltage of the N type diffusion layer 137. Referring to FIG. 13b, when the injecting energy is 150 KeV or higher, the junction withstand voltage of the N type diffusion layer 137 exceeds 10.2V. When the injecting energy is 140 KeV or less, the junction withstand voltage of the N type diffusion layer 137 becomes 10.2V or less. Thus, it is clear that an adverse situation takes place. When the injecting energy is 140 KeV or less, the junction depth of the N type diffusion layer 137 is not much larger than the junction depth of the $N^+$ type diffusion layer 117. It is assumed that due to the presence of the N type diffusion layer 137, the concentration slope becomes sharp and the N type diffusion layer 137 does not work properly.

Figure 14A:
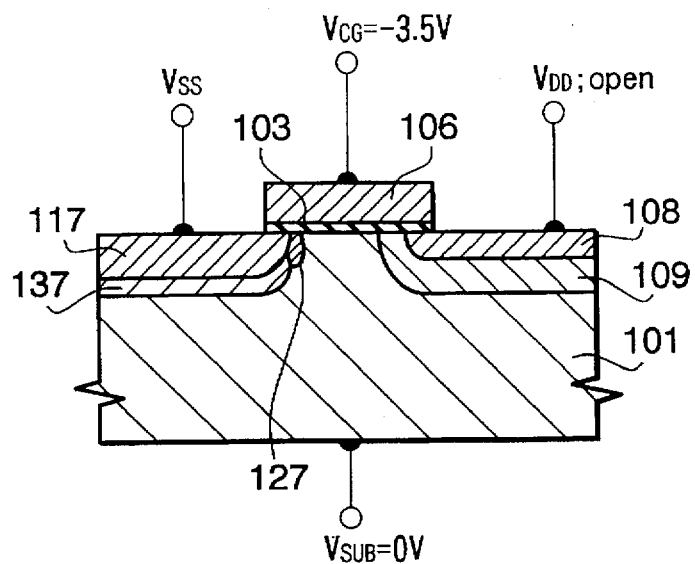
FIG. 14a is a cross-sectional view showing a TEG for measuring a junction withstand voltage of an $N^-$ type diffusion layer that makes up a source region.
Figure 14B:
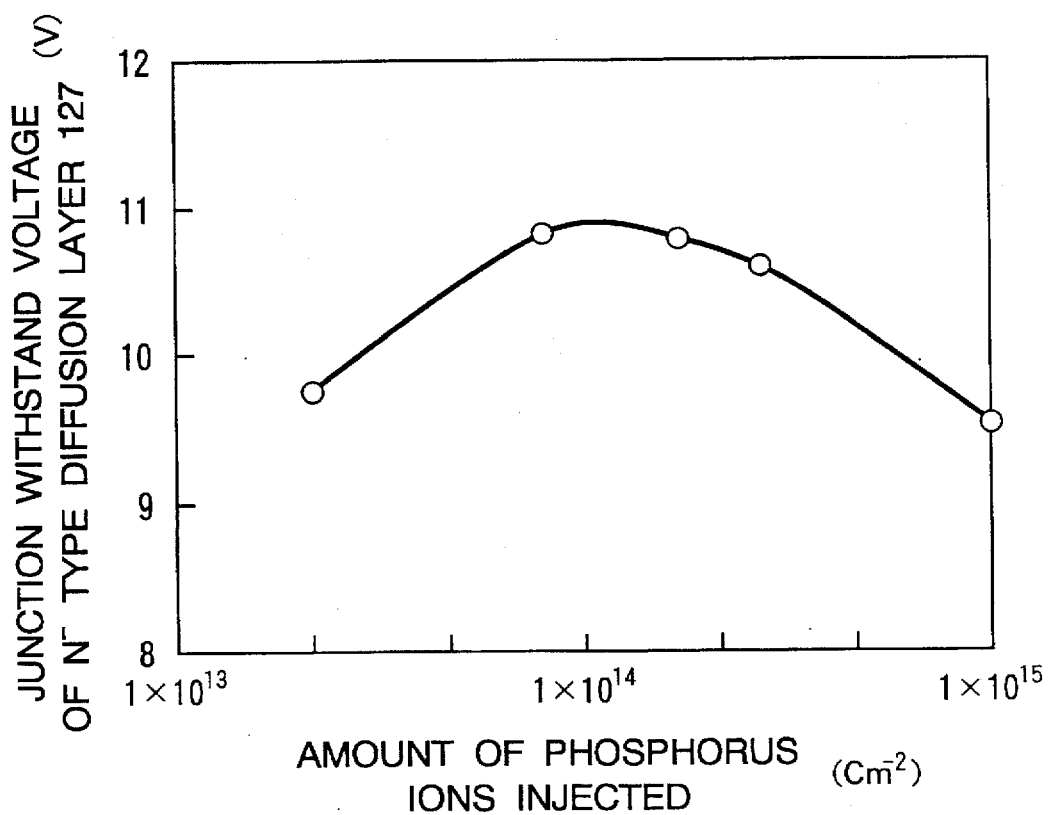
FIG. 14b is a graph showing dependency of ion injecting energy for forming an $N^-$ type diffusion layer against a junction withstand voltage of an $N^-$ type diffusion layer.

It is difficult to measure the withstand voltage when data is erased from a memory cell to which data has been written. To measure the withstand voltage, a TEG was used. The TEG had a control gate electrode 106 directly formed on a gate oxide film 103 without a floating gate electrode. With the TEG, the junction withstand voltage of the $N^-$ type diffusion layer 127 was measured when data was erased from a memory cell to which the data had been written at $V_{CC}=-3.5V$. At that point, as ion injecting conditions for forming the N type diffusion layer 137, the ion injecting energy was 180 KeV and the amount of phosphorus ions injected was $1\times10^{15}$ cm$^{-2}$. The injecting energy for forming the $N^-$ type diffusion layer 127 was 40 KeV. The amount of phosphorus ions injected for forming the $N^-$ type diffusion layer 127 was varied. FIG. 14b shows the results. Referring to FIG. 14b, the maximum value (approximately 11V) of the junction withstand voltage of the $N^-$ type diffusion layer 127 takes place where the amount of phosphorus ions injected is $1\times10^{14}$ cm$^{-2}$. Consequently, the amount of phosphorus ions injected is preferably in the range from $0.7\times10^{14}$ cm$^{-2}$ to $2\times10^{14}$ cm$^{-2}$.

As described above, according to the embodiment, since the $N^-$ type diffusion layer 127 and the N type diffusion layer 137 are formed along with the $N^+$ type diffusion layer 117, even if the size of the memory cells is reduced, the withstand voltage of the source region 107 and erase speed are increased. In addition, repetitive characteristics are improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A non-volatile semiconductor memory cell, comprising:

a floating gate electrode formed on a front surface of a P type silicon substrate through a gate oxide film;

a control gate electrode formed on a front surface of said floating gate electrode through a gate insulation film, said control gate electrode working as a word line;

a source region including:

a first $N^+$ type diffusion layer having a first junction depth and formed on the front surface of the P type silicon substrate, an N type diffusion layer having a second junction depth larger than the first junction depth, the N type diffusion layer being connected to the $N^+$ type diffusion layer and formed on the front surface of the P type silicon substrate, and an $N^-$ type diffusion layer formed just below said floating gate electrode through the gate oxide film, the width of said $N^-$ type diffusion layer being larger than each of the $N^+$ type diffusion layer and the N type diffusion layer, the $N^-$ type diffusion layer having a junction depth smaller than at least the second junction depth, the $N^-$ type diffusion layer being connected to the $N^+$ type diffusion layer and formed on the front surface of the P type silicon substrate;

a drain region including a second $N^+$ type diffusion layer having a junction depth smaller than the first junction depth and being formed on the front surface of the P type silicon substrate; and a bit line connected to said drain region.

2. The non-volatile semiconductor memory cell claimed in claim 1, further comprising:

a $P^-$ type diffusion layer formed on the front surface of the P type silicon substrate and adapted for covering the junction surface of the second $N^+$ type diffusion layer.

3. A non-volatile semiconductor memory cell comprising a floating gate, a control gate, a source region, and a drain region, wherein the source region has a relatively high concentration region that overlaps the floating gate with a first width and a first relatively low concentration region that covers side and bottom surfaces of the high concentration region and that overlaps the floating gate with a second width that is larger than the first width;

and a second relatively low concentration region formed on drain side of the first low concentration region, the concentration of said second low concentration region being smaller than the concentration of the first low concentration region.

4. The non-volatile semiconductor memory cell claimed in claim 3, wherein said second low concentration region has a junction depth which is smaller than the junction depth of the first low concentration region.

* * * * *